United States Patent
Lavagno et al.

(10) Patent No.: US 8,286,108 B2
(45) Date of Patent: Oct. 9, 2012

(54) SYSTEM AND METHOD FOR SYNTHESIS REUSE

(75) Inventors: Luciano Lavagno, San Jose, CA (US); Alex Kondratyev, San Jose, CA (US); Yoshinori Watanabe, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 45 days.

(21) Appl. No.: 12/651,418

(22) Filed: Dec. 31, 2009

(65) Prior Publication Data

US 2010/0162189 A1 Jun. 24, 2010

Related U.S. Application Data

(62) Division of application No. 11/324,004, filed on Dec. 30, 2005, now Pat. No. 7,673,259.

(51) Int. Cl.
*G06F 17/50* (2006.01)
(52) U.S. Cl. ......... 716/103; 716/101; 716/104; 703/14
(58) Field of Classification Search .......... 716/101, 716/103, 104; 703/14
See application file for complete search history.

(56) References Cited

U.S. PATENT DOCUMENTS

| | | | |
|---|---|---|---|
| 5,003,487 A * | 3/1991 | Drumm et al. ......... | 716/104 |
| 5,541,849 A * | 7/1996 | Rostoker et al. ......... | 716/102 |
| 5,648,913 A * | 7/1997 | Bennett et al. ......... | 716/113 |
| 6,216,252 B1 * | 4/2001 | Dangelo et al. ......... | 716/102 |
| 6,226,776 B1 * | 5/2001 | Panchul et al. ......... | 716/102 |
| 6,530,073 B2 * | 3/2003 | Morgan ......... | 716/102 |
| 6,609,244 B2 * | 8/2003 | Kato et al. ......... | 716/104 |
| 6,691,301 B2 * | 2/2004 | Bowen ......... | 717/114 |
| 6,760,888 B2 * | 7/2004 | Killian et al. ......... | 716/102 |
| 6,779,163 B2 | 8/2004 | Bednar et al. | |
| 6,820,240 B2 | 11/2004 | Bednar et al. | |
| 6,883,152 B2 | 4/2005 | Bednar et al. | |
| 6,983,227 B1 * | 1/2006 | Thalhammer-Reyero ......... | 703/2 |
| 6,996,799 B1 * | 2/2006 | Cismas et al. ......... | 717/106 |
| 7,062,728 B2 * | 6/2006 | Tojima ......... | 716/103 |
| 7,181,703 B1 * | 2/2007 | Borer et al. ......... | 716/104 |
| 7,302,670 B2 * | 11/2007 | Bowyer et al. ......... | 716/102 |
| 7,346,483 B2 * | 3/2008 | Toma et al. ......... | 703/15 |
| 7,350,180 B1 * | 3/2008 | Slavin ......... | 716/103 |
| 7,472,361 B2 * | 12/2008 | Watanabe et al. ......... | 716/103 |
| 7,587,687 B2 | 9/2009 | Watanabe et al. | |
| 7,673,259 B2 | 3/2010 | Lavagno et al. | |
| 7,711,536 B2 * | 5/2010 | McNamara ......... | 703/14 |
| 7,778,815 B2 * | 8/2010 | Pasricha et al. ......... | 703/22 |
| 7,823,120 B2 * | 10/2010 | Kazakov et al. ......... | 717/104 |
| 7,865,345 B2 * | 1/2011 | Odagawa et al. ......... | 703/13 |
| 2002/0133325 A1 * | 9/2002 | Hoare et al. ......... | 703/17 |
| 2003/0154465 A1 * | 8/2003 | Bollano et al. ......... | 717/137 |
| 2004/0044514 A1 * | 3/2004 | Granny et al. ......... | 703/23 |
| 2005/0080610 A1 * | 4/2005 | Toma et al. ......... | 703/22 |
| 2005/0149898 A1 | 7/2005 | Hakewill et al. | |
| 2006/0112364 A1 * | 5/2006 | Alpert et al. ......... | 716/10 |
| 2007/0067751 A1 | 3/2007 | Seno | |
| 2007/0164785 A1 * | 7/2007 | He ......... | 326/41 |

* cited by examiner

*Primary Examiner* — Naum Levin

(74) *Attorney, Agent, or Firm* — Schwegman Lundberg & Woessner, P.A.

(57) ABSTRACT

A method of synthesis of multiple implementations of a design is provided comprising: translating a model of the design to a first output model compliant with first constraints; and translating the model of the design to a second output model compliant with second constraints.

24 Claims, 4 Drawing Sheets

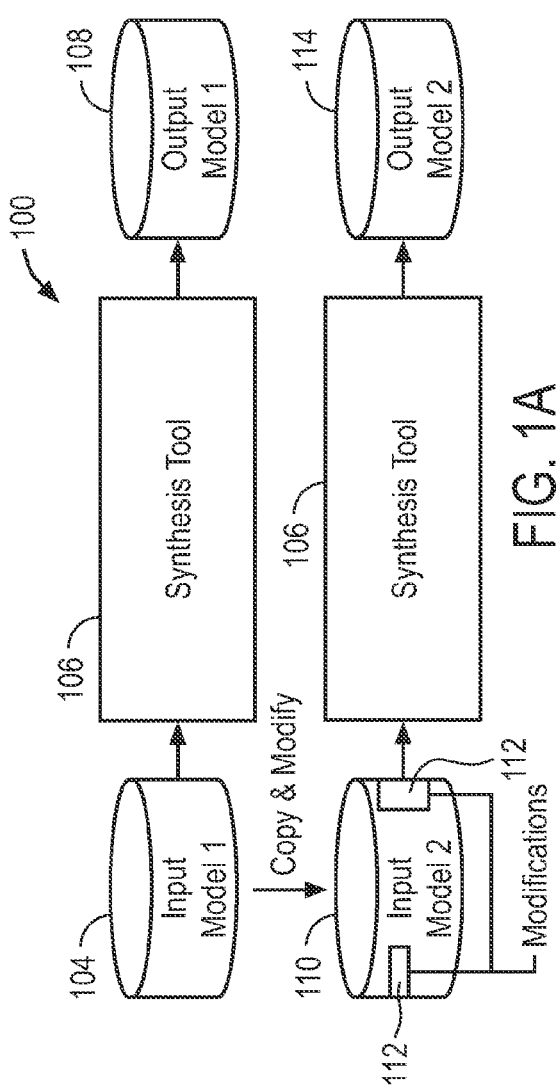
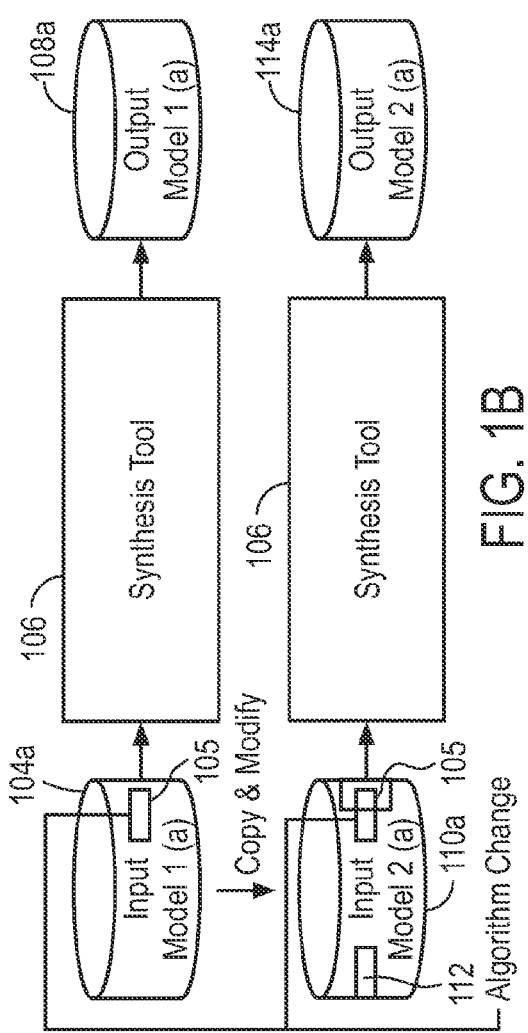

SYSTEM AND METHOD FOR SYNTHESIS REUSE

CROSS REFERENCE TO RELATED APPLICATIONS

This is a divisional U.S. application Ser. No. 11/324,004, filed Dec. 30, 2005, U.S. Pat. No. 7,673,259, filed Dec. 30, 2005. This application relates to the following commonly assigned patent applications: System and Method for Verification Aware Synthesis, filed Dec. 30, 2005, U.S. Pat. No. 7,711,536; System and Method for Generating a Plurality of Models at Different Levels of Abstraction from a Single Master Model, filed Dec. 30, 2005, U.S. Pat. No. 7,472,361, issued Dec. 30, 2008; and System and Method for Incremental Synthesis, filed Dec. 30, 2005, U.S. Pat. No. 7,587,687, issued Sep. 8, 2009, each of which is expressly incorporated herein in its entirety by this reference.

BACKGROUND OF THE INVENTION

1. Field of the Invention

The invention relates in general to the automated design of integrated circuits, and more particularly, to design synthesis.

2. Description of the Related Art

Modern circuit design has evolved into a specialized field often referred to as electronic design automation in which computers and computer aided design (CAD) techniques are used to automate the integrated circuit (IC) design process. An IC design process typically begins with an engineer producing a high level design specification in terms of input/output signals, functionality and performance characteristics of a hardware circuit to be fabricated. These characteristics are captured in a high level hardware language model, which represents a design at a higher level of abstraction, which leaves unspecified many of the detailed elements of individual design objects that eventually a designer will need to consider. The designer then begins a process of incremental refinement, where he, often using a software-based tool, replaces highly abstracted elements of the design with more precisely specified elements that implement the same functionality. At each point he is making choices to implement the high level element in perhaps a way that will use less power than other ways, or use less space, or run more quickly, all according to his overall goals for the circuit.

Synthesis can be defined broadly as an automatic translation process from a description at higher level of abstraction to a description at a lower level of abstraction of the design. The names commonly used in the field of IC design for the different levels of abstraction of design description are "behavioral", "register transfer level (often abbreviated as RTL)", "gate level netlist (also known as a structural design)" and physical (often called "GDS2", based on the name of a standard language for such descriptions). A structural representation comprises a one-to-many mapping of a behavioral representation onto a set of components in accordance with design constraints such as cost, area, delay and power consumption. The structural design contains no layout information; that is introduced by the transformation to GDS2.

Each component in a structural design, in turn may be defined by its own behavioral description. Thus, a design can be represented at many different levels of abstraction, and different software-based synthesis tools typically are used depending upon the level of abstraction at which a design is specified, and the level at which a more refined design is desired For example, a system level synthesis tool may be used to translate a behavioral description at an algorithm or flow chart level to an RTL representation including components such as muxes, memories and buses. A register-transfer level synthesis tool may be used to translate a design description at the register transfer level to a structural representation including components such as gates and flip-flops, for example. Thus, design of an IC may involve multiple levels of synthesis. Synthesis sometimes is referred to as design refinement, since it adds an additional level of detail to a design that, in turn, provides information needed for the next level of synthesis or manufacturing process.

Generally, a more detailed design representation generated from a higher level representation by a synthesis-translation process must satisfy constraints supplied with the original high level design description or generated from a previous synthesis step. Constraints on design behavior, therefore, guide the synthesis of the design towards practical implementations in terms of factors such as performance, costs, testability and other physical restrictions. Physical constraints typically are specified separately from behavior either by declaration or in a separate file.

While prior approaches to synthesis generally have been acceptable, there have been shortcoming with their use. For instance, in the past users were required to created unique behavioral models for each desired implementation, even though the designs might be substantially similar Different implementations of a single behavioral design might include for example, a version designed to run at 500 MHz and use a 90 nanometer process, and one designed to run at 1 gigahertz, and use a 60 nanometer process. These two designs perform the exact same function, but because current state of the art RTL synthesis tools require substantially different designs in order to perform at these two performance points, user are required to maintain two different designs as input. As design requirements evolved in the course of the design process, users typically would implement these new requirements in each of the unique behavioral models.

FIGS. 1A-1B are illustrative drawings of a prior design processes 100, 102 in which each of two different behavioral models, representing different implementations of the same functionality, are modified to incorporate changed requirements. In FIG. 1A, a first input model 104 is provided as input to a software-based synthesis tool 106, which performs a synthesis-translation process and outputs a first output model 108, which is a lower level structural representation of the first input model 104. If the user wishes to produce another design similar to the design represented by the first input model 104, then the user copies and modifies the first input model 104 so as to produce a second input model 110. Modifications 112 may involve adding additional pipeline stages, replicating logic in multiple places because there is not sufficient time for the signal to propagate in the faster clock cycle design, as well as other tricks to enable a design to run in a shorter clock cycle in a faster process, for example. The second input model 110 is provided as input to a software-based synthesis tool 106, which performs the synthesis-translation process and outputs a second output model 114.

Referring to FIG. 1B, after the first and second models have been created as described with reference to FIG. 1A, a user may wish to fix a design flaw (i.e. a bug) or to enhance high level behavioral algorithm 105. In either case, the user must modify both the original first model to produce a revised first model 104a and to produce a revised second model 110a. The modified first input model 104a is provided as input to the synthesis tool 106, which outputs a modified first output model 108a. The modified second input model 104a is provided as input to the synthesis tool 106, which outputs a modified first output model 110a is provided as input to the synthesis tool 106, which outputs a modified first output model 114a.

While this approach to the proliferation and modification of design models generally has been acceptable, there have been shortcomings with its use. For example, given the many design derivatives and modifications management of the design change process can quickly become complex and difficult to manage. As a result it has been difficult to migrate designs to different clock frequencies, limiting the ability to tailor a solution to high performance, high power environment, as well as lower power, cost-sensitive applications. Instead all but the most well funded designers must pick a middle of the road implementation, "good enough" for multiple uses, but not specifically suited to many one application space. Thus, there has been a need for improvements in the management of design changes and design derivative. The present invention meets this need.

SUMMARY OF THE INVENTION

In one aspect, a method of synthesis of multiple implementations of a design is provided. A model of the design is translated to a first output model compliant with first constraints. The model of the design is translated to a second output model compliant with second constraints.

BRIEF DESCRIPTION OF THE DRAWINGS

FIGS. 1A-1B are illustrative drawings of a prior design system and process in which each of two different behavioral models, representing different implementations of the same functionality, are modified to incorporate changed requirements or to fix design flaws.

DETAILED DESCRIPTION OF THE PREFERRED EMBODIMENTS

Figure 2A:
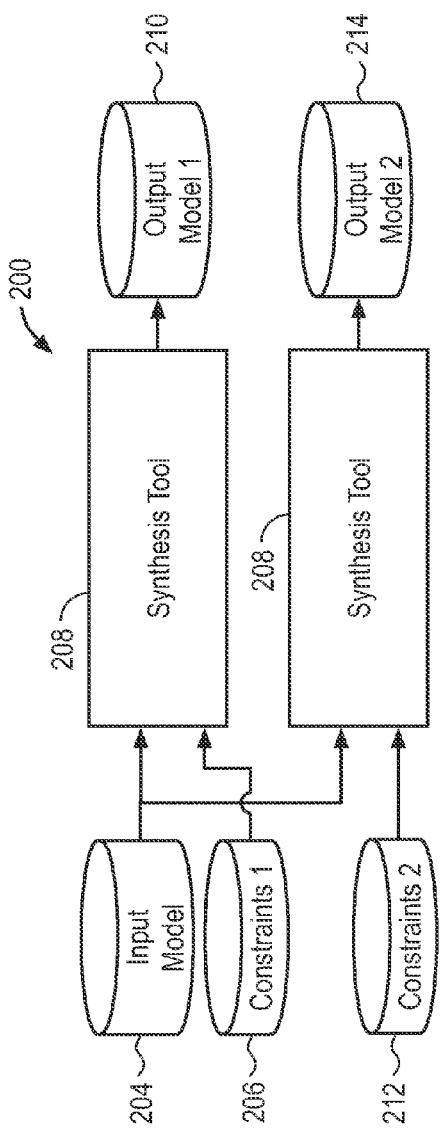
FIGS. 2A-2B are illustrative drawings representing a novel synthesis system and method in accordance with an embodiment of the invention.

The following description is presented to enable any person skilled in the art to make and use a system and method for synthesis reuse in the design and implementation of integrated circuits in accordance with the embodiments of the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and devices are shown in block diagram form in order not to obscure the description of the invention with unnecessary detail. Identical components appearing in more than one drawing may be labeled with identical reference numerals. Thus, the present invention is not intended to be limited to the embodiments shown, but is to be accorded the widest scope consistent with the principles and features disclosed herein.

Figure 2B:
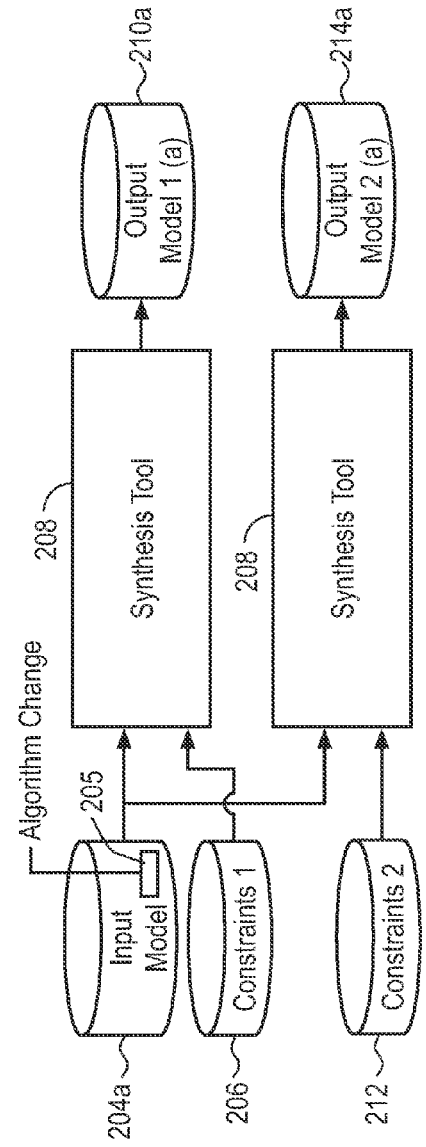

FIGS. 2A-2B are illustrative drawings representing novel synthesis processes 200, 202 in accordance with an embodiment of the invention. Referring to FIG. 2A, an input model 204 (a base model) plus first input constraints 206 are provided as input to a computer software-based synthesis tool 208. The synthesis tool translates the first input model as constrained by the first input constraints 206, to produce a first output model 210. Similarly, the same input model 204 plus second constraints 212 are provided as input to the computer software-based synthesis tool 208. The synthesis tool 208 translates the first input model 204 as constrained by the second input constraints 212, to produce a second output model 214.

Thus, different output models 210, 214 are produced from the same input model 204 by providing different input constraints 206, 212. This is much easier as the constraint files are typically $\frac{1}{100}^{th}$ the size of the input model, and a single line in the constraint file will have a broad effect on the translation of the input model to the output model. Without this ability, one could need to copy the input file, and make a large number of changes throughout the model in order to replicate the same effect. Moreover, there is only a single base model 204 despite the proliferation of output models 210, 214. Because of this, should there be discovered an error in the base model, it need be fixed in just one place, and then the many constraint files used to generate the many versions of the chip can re used as is to effect the fix across the entire family of products.

The (base) input model 204 comprises just a description, at a very high level, of the algorithm to be implemented. The particular choices (e.g., Should adds take two cycles or three cycles? How much buffer should there be between the frame reader and the frame renderer?) of how to realize the algorithm are instead specified in the constraint file(s). This has a secondary advantage because the input model is much easier to understand, as it its not cluttered up with particular realization choices. It is pure algorithmic code. The first and second constraints 206, 212 are contained in files different and apart from the input model 204 to facilitate this reuse. Each constraint file includes a number of specifications on how the algorithm is to be realized for this run. At a minimum the constraint file should include a specification of the desired clock frequency, and the name of a technology library of gates to use to realize the design. If the constraint files has no more than this, the system will make default choices, balancing all operations equally, and giving a rather generic implementation. As the user adds more constraints, he can then get a tuned design optimal for his particular application.

Referring to FIG. 2B, a user may desire to change the base input model for some reason such as to fix a design flaw (i.e. bug) otherwise change or enhance an algorithm 205, for example. A modified version of the input model 204a incorporating the changed algorithm 205 plus the first input constraints 206 are provided as input to the computer software-based synthesis tool 208. The synthesis tool 208 translates the modified input model 204a as constrained by the first input constraints 206, to produce a first modified output model 210a. Similarly, the same modified version of the input model 204a plus the second input constraints 212 are provided as input to the computer software-based synthesis tool 208, which translates the modified input model 204a as constrained by the second input constraints 212, to produce a second modified output model 214a.

Thus, changes are made only to the single (base) input model 204. The resulting changed input model 204*a* is used with different constraints 206, 212 to produce different changed output models 210*a*, 214*a*. As compared with the process detailed in FIGS. 1A-1B, it can clearly been seen why this process is much easier for the user. The algorithm need be crafted once, and just the guidance on how to implement it for the different processes (boxes 206 and 212) must be prepared in order to map the algorithm to the specific process or usage criteria.

The system and method of the embodiment of FIGS. 2A-2B, advantageously allows a user to easily create an input model which captures the design intent, and then to easily and naturally specify the particular mappings of the design into the particular usage scenario (e.g., high speed, no power requirements; battery saving, lower fidelity requirements) envisioned. The constraint files contain sufficient information to permit a user to guide the synthesis tool 208 to implement the base model in a way that satisfies a desired use scenario.

Because the tool is presented with the high level model of the algorithm, and separately the set of constraints to use when mapping the algorithm to a lower level of abstraction, RTL model, it is much easier for the user to guide the choices the tool makes. The user can run the tool once, with little guidance, and observe the quality of the result. He might decide that the number of pipeline stages the tool chose to use for the adder (say, 5) is too many, and add a constraint that the adder be implemented with a 4 stage pipe. Re-running the tool, the tool will follow this rule, and hence have less space available to implement pipeline stages for other operations, and hence pick on to suffer from the enhancement of the adder. If the user is unhappy with the one the tool chose, he could add a constraint for that one. It should be noted that in the past, the user often was required to recode the implementation to add or remove pipeline stages, a process that is tedious and error prone, often requiring as much as a week or more of coding and testing. A system and method in accordance with the embodiment herein, therefore, can be a big time saver.

More specifically, for example, in one embodiment the system and method FIGS. 2A-2B can, given (1) an input model which describes the functionality of the hardware to be created, in any of the many Hardware Description Languages in use, such as IEEE 1364 Verilog, IEEE 1076 VHDL, IEEE 1800 SystemVerilog, or IEEE 1666 SystemC, and (2) a set of constraints, specifications and/or on how the design should be synthesized, including specifications on what libraries to be used, what device technology to be used, timing and area goals for various parts of the design and other implementation specific information, produce (1) an output model, which maps the functionality described in the input model to a precise format in a standard hardware description language, such as IEEE 1364.1 Verilog and/or IEEE 1076.6 VHDL, for example, while complying with the constraints, specifications and/or goals contained in the various files that make up (2) the set of constraints.

Code Examples

Consider the following example of (base) input model code, written in the IEEE 1666 SystemC Hardware Description Language ---
Base Input Model Code
---
```
class alu: public sc_module {
    ...
    SC_THREAD(multiplier_1);
    SC_THREAD(multiplier_2);
    ...
    void multiplier_1( ) {
        while (true)
            if (ENABLE && OPCODE_1 == MULT) {
                port_OUT1 =
                    port_IN1_A.read( ) * port_IN1_B.read( );
            }
    }
    void multiplier_2( ) {
        while (true)
            if (ENABLE && OPCODE_2 == MULT) {
                port_OUT2 =
                    port_IN2_A.read( ) * port_IN2_B.read( );
            }
    }
}
```
---

Such SystemC models are typically converted by a tool known as a synthesizer, to a more detailed specification, at a lower level of abstraction, known as a Register Transfer Level (RTL) model. Such conversions are typically controlled by a set of directives, which specify the clock speed of the desired circuit, or the particular resource assignment for the conversion.

For example, the following is a first output model code realization requiring very fast operation, the design described in the above base input model code might be best realized by an implementation with two multipliers, one for multiplier_1, and the other for multiplier_2 which operate at the same time.

The following is an example of first constraint file code that could be used to select for very fast operation.

---
First Constraint File Code
---
```
;; Specify that alu's multipler_1 and multiplier_2 get
;; their own implementation by mapping them to different
;; names
(map alu::multiplier_1 m1)
(map alu::multiplier_2 m2)
```
---

The following is an example of a first output model code produced from the (base) input model code as constrained by the first constraint file code.

---
First Output Model Code
---
```
module calc (input enable, clock, reset;
            input [4:0] opcode_1, opcode_2;
            input [31:0] in1_a, in1_b, in2_a, in2_b;
            output [31:0] out1, out2; );
    multiplier m1 ( enable, clock, reset, opcode_1,
        in1_a, in1_b, out1);
```

| First Output Model Code |
| --- |
| ```
            multiplier m2 (enable, clock, reset, opcode_2,
                    in2_a, in2_b, out2);
endmodule // calc
module multiplier (input enable, clock, reset;
                input [4:0] opcode;
                input [31:0] ina, inb;
                output [31:0] out;);
    reg [5:0] state, next_state;      // state machine
    reg [31:0] r1, r2, o;              // intermediate values
    parameter s0 = 0, s1 = 1, s2 = 2, s3 = 3;
    always (@ posedge clock) begin
        if (reset) state = s0;
        else state = next_state;
    end
    always (@negedge clock) begin
        case (state)
            s0: if (enable && opcode == MULT)
                        next_state = s1;
            s1: begin
                    //psl assert (!enable)
                    r1 = in1;
                    r2 = in2;
                    next_state = s2;
                end
            s2: begin
                    o = r1 * r2;
                    next_state = s3;
                end
            s3: begin
                    out = o;
                    next_state = s0;
                end
        endcase
    end
endmodule
``` |

Alternatively, if the same overall design functionality is to be realized in a low power, lower performance environment, it may make sense to implement the design with one multiplier, which is shared by the needs to do multiplication 1 and 2. This will require additional logic to orchestrate the execution of multiplies for OPCODE_1 and OPCODE_2 in a scheduled manner, where just one multiply is done at a time, and hence the other must wait, in those circumstances where execution of the design's logic calls for two multiply operations to occur.

The following is an example of a second constraint file code that could be used to select low power operation.

| Second Constraint File Code |
| --- |
| ```
;; Specify that alu's multiplier_1 and multiplier_2 share
;; a single unit by maping them to the same name
(map alu::multiplier_1 m)
(map alu::multiplier_2 m)
``` |

The following is an example of a second output model code produced from the (base) input model code as constrained by the second constraint file code.

| Second Output Model Code |
| --- |
| ```
module calc (input enable, clock, reset;
            input [4:0] opcode_1, opcode_2;
            input [31:0] in1_a, in1_b, in2_a, in2_b;
            output [31:0] out1, out2; );
    wire [31:0] ina, inb, out;
    wire enable_int;
    reg [2:0] op;
    parameter OPA = 2'b1; OPB = 2'b10;
    multiplier m ( enable_int, clock, reset, opcode,
                ina, inb, out);
    assign ina =    (op == OPA) ? in1_a :
                    (op == OPB) ? in2_a : 32'bz;
    assign inb =    (op == OPA) ? in1_b :
                    (op == OPB) ? in2_b : 32'bz;
    assign opcode = (op == OPA) ? opcode_1 :
                    (op == OPB) ? opcode_2 : 4'bz;
    assign out1 = (op == OPA) ? out : 32'bz;
    assign out2 = (op == OPB) ? out : 32'bz;
    assign enable_int = (op == OPA || op == OPB) ?
                                enable : 1'b0;
    always @( posedge clock ) begin
        case ({enable,opcode_1==MULT,opcode_2==MULT})
            3'b0xx : // enable is zero, do nothing
            3'b100 : // neither opcode is mult, do nothing
                        op = 2'b0;
            3'b101 : op = OPA;
            3'b110 : op = OPB;
            3'b111 : begin // must do both; A then B
                        op = OPA;
                        @(posedge clock);
                        op = OPB;
                    end
        endcase
    end
    multiplier m2 (enable, clock, reset, opcode_2,
                in2_a, in2_b, out2);
endmodule // calc
module multiplier (input enable, clock, reset;
                input [4:0] opcode;
                input [31:0] ina, inb;
                output [31:0] out;);
    reg [5:0] state, next_state;     // state machine
    reg [31:0] r1, r2, o;             // intermediate values
    parameter s0 = 0, s1 = 1, s2 = 2, s3 = 3;
    always (@ posedge clock) begin
        if (reset) state = s0;
        else state = next_state;
    end
    always (@negedge clock) begin
        case (state)
            s0: if (enable && opcode == MULT)
                        next_state = s1;
            s1: begin
                    //psl assert (!enable)
                    r1 = in1;
                    r2 = in2;
                    next_state = s2;
                end
            s2: begin
                    o = r1 * r2;
                    next_state = s3;
                end
            s3: begin
                    out = o;
                    next_state = s0;
                end
        endcase
    end
endmodule
``` |

It will be noted that the particular syntax of the above constraint file code examples is not important to the practice of the invention therefore, should be understood to be example syntax rather than definitive syntax.

However, despite the complexity in of the second output model code, the scheduling logic is much smaller that the actual multiply logic, and if it is expected that it will only rarely be the case that there are two multiplies needed in the machine, so the degradation in performance of the algorithm will be acceptable.

As is evident, the actual RTL code required to describe the multiplexed multiply and the parallel multiply implementation of the algorithm is quite different; but the description of the overall logic at the SystemC level is the same. Users of a synthesis tool in accordance with the invention need only describe a desired algorithm once, and then describe the mapping of operations to resources specifically for each implementation desired. This separation of description of the algorithm from the implementation allows many derivative implementations to be quickly developed from a single description.

Figure 3:
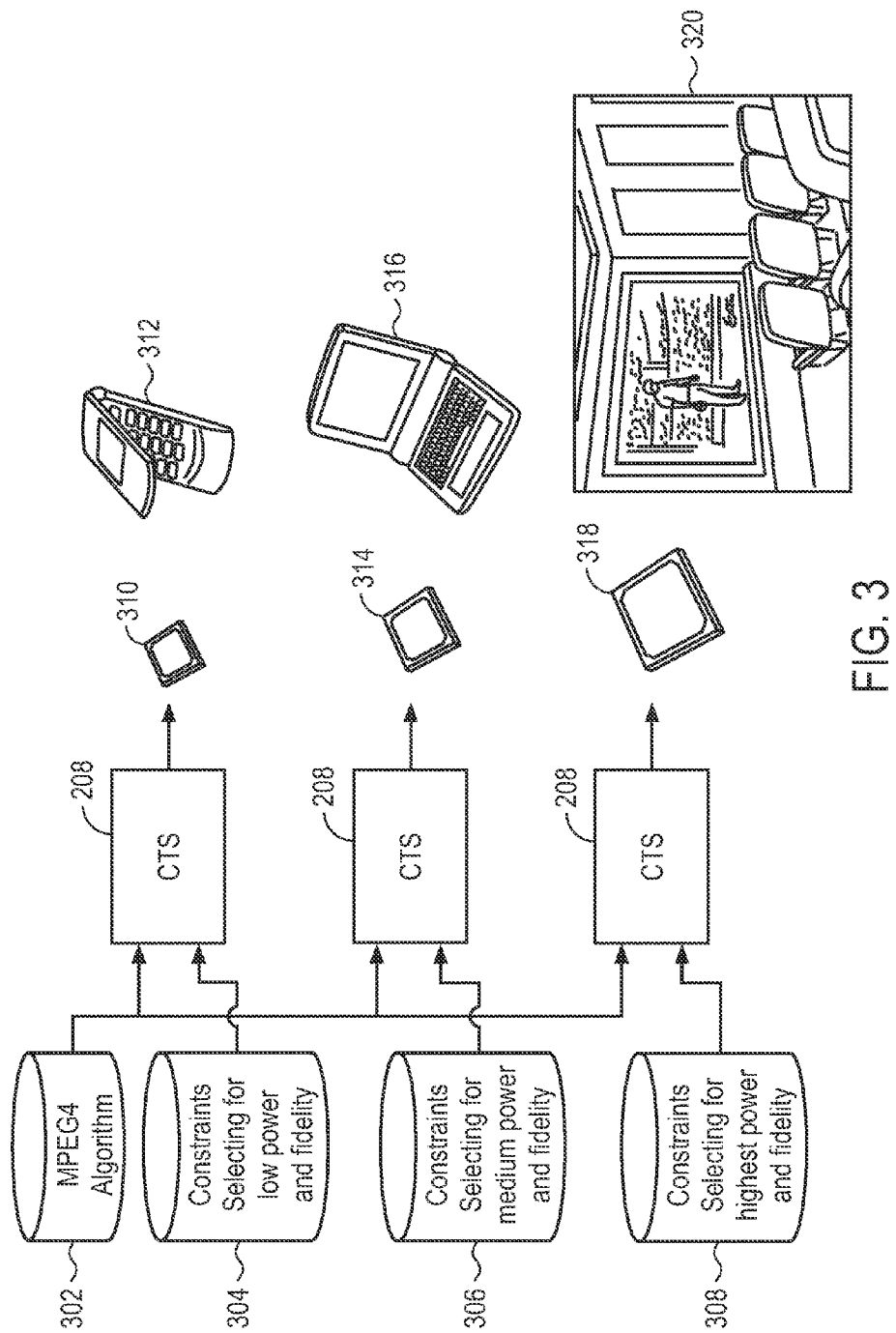
FIG. 3 is an illustrative drawing of a system and method in accordance with an embodiment of the invention for using a single base input model to produce multiple different IC implementations of an MPEG4 decoder for use in different environments having different power and fidelity constraints.

FIG. 3, for example, is an illustrative drawing of a system and method 300 in accordance with an embodiment of the invention for using a single base input model to produce multiple different IC implementations of an MPEG4 decoder for use in different environments having different power and fidelity constraints. A base input model 302 of an MPEG4 algorithm is provided. A first set of constraints 304 is provided that is suitable for low power and low fidelity, characteristics of an MPEG4 video decoder IC 310 used in a cell phone 312, for example, where there is very little power available, and where errors in the output display to a two inch screen will not be visible to the end user. A second set of constraints 306 is provided that is suitable for medium levels of power and fidelity, characteristics of an MPEG4 video decoder IC 314 used in a laptop computer 316, for example. A third set of constraints 308 is provided that is suitable for higher levels of power and fidelity, characteristics of an MPEG4 video decoder IC 318 used in a home theatre environment 320, for example, with a very large screen. The home theatre environment 320 requires that the decoding be done with high fidelity, as the projection to a large fifty inch screen will reveal any decoding errors quite clearly. Moreover, in a home theatre environment, there are adequate power and cooling facilities available to perform the operations in parallel in order to achieve the best performance.

As depicted in FIG. 3, the same base model 302 is provided to the synthesis tool 208 with each of the three sets of input constraints 304, 306, 308. The first set of input constraints 304 constrain the synthesis tool 208 to translate the input model 302 to a first output model (not shown) that can be used to manufacture an IC 310 best suited for use in a cell phone 312. The second set of input constraints 306 constrain the synthesis tool 208 to translate the input model 302 to a second output model (not shown) that can be used to manufacture an IC 314 well suited for use in a laptop computer 316. The third set of input constraints 308 constrain the synthesis tool 208 to translate the input model 302 to a third output model (not shown) that can be used to manufacture an IC 318 best suited for use in a home theatre environment 320.

In the event of a modification to the MPEG4 to algorithm (either a new version of the protocol, or a bug is discovered in the original description), all of the derivative descriptions (e.g. cell phone, laptop, home theatre) can be created quickly using the changed input model (not shown) and appropriate individual constraint files.

Figure 4:
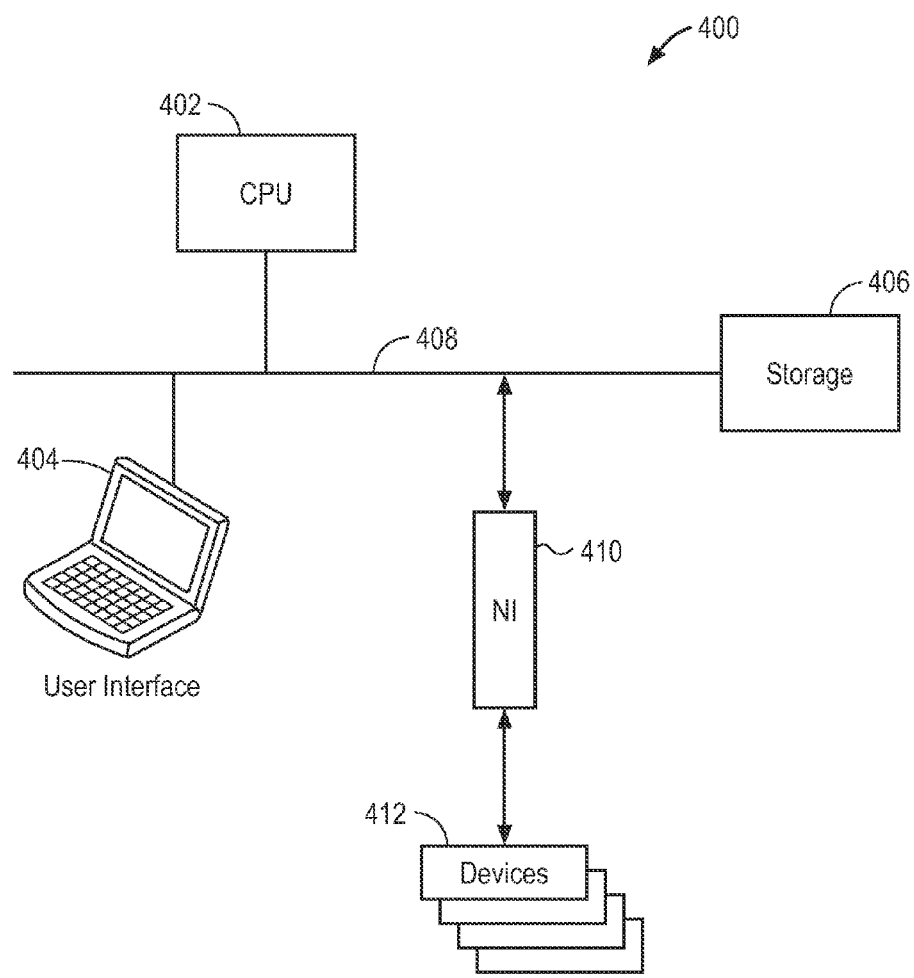
FIG. 4 is a schematic drawing of an illustrative computer system that can be programmed to implement the system and method of FIGS. 2-3 in accordance with an embodiment of the invention.

FIG. 4 is a schematic drawing of an illustrative computer system 400 that can be programmed to implement system and method of FIGS. 2A-2B and FIG. 3 in accordance with an embodiment of the invention. The computer system 400 includes one or more central processing units (CPU's) 402, a user interface 404, computer readable storage media 406, a system bus 408, and one or more bus interfaces for connecting the CPU, user interface, memory and system bus together. The computer system also includes a network interface 410 for communicating with other devices 412 on a computer network. A computer readable base input model and constraint files and output models of FIGS. 2A-2B and FIG. 3 may be provided, via bus 408, from interface 404, storage 406 or other devices 412, to and from the synthesis tool 208 running from storage 406 on the CPU 406.

While the invention has been described herein with reference to various illustrative features, aspects and embodiments, it will be appreciated that the invention is susceptible of variations, modifications and other embodiments, other than those specifically shown and described. The invention is therefore to be broadly interpreted and construed as including all such alternative variations, modifications and other embodiments within its spirit and scope as hereinafter claimed.

The invention claimed is:

1. A method of synthesis of multiple implementations of an integrated circuit design, comprising:
providing a model of the design comprising an algorithm implemented by the design;
using a computer system to perform steps of:
providing a first constraint file including at least one first constraint upon implementation of the model;
inputting the model of the design and the first constraint file to a synthesis tool;
receiving as output from the synthesis tool an output model of the design for implementing the design to meet the at least one first constraint;
providing a second constraint file including at least one second constraint upon implementation of the model;
inputting the model of the design and the second constraint file to the synthesis tool;
receiving as output from the synthesis tool an output model of the design for implementing the design to meet the at least one second constraint;
changing the model of the design to produce a changed model of the design;
inputting the changed model of the design and the first constraint file to the synthesis tool; and
receiving as output from the synthesis tool an output model of the design for implementing the design to meet the at least one first constraint.

2. The method of claim 1, wherein the first constraint file including at least one first constraint is directed to higher speed operation of the integrated circuit than is the second constraint file including at least one second constraint.

3. The method of claim 1, wherein the first constraint file including at least one first constraint is directed to lower power operation of the integrated circuit than is the second constraint file including at least one second constraint.

4. The method claim 1, wherein the first constraint file including at least one first constraint is directed to higher fidelity performance of the integrated circuit than is the second constraint file including at least one second constraint.

5. A method of synthesis of multiple implications of an integrated circuit design, comprising:
providing a model of the design comprising an algorithm implemented by the design;
using a computer system to perform steps of:
providing a first constraint file including at least one first constraint upon implementation of the model;
inputting the model of the design and the first constraint file to a synthesis tool;
receiving as output from the synthesis tool an output model of the design for implementing the design to meet the at least one first constraint;

providing a second constraint file including at least one second constraint upon implementation of the model;
inputting the model of the design and the second constraint file to the synthesis tool;
receiving as output from the synthesis tool an output model of the design for implementing the design to meet the at least one second constraint;
changing the model of the design to produce a changed model of the design;
inputting the changed model of the design and the constraint files to the synthesis tool; and
receiving as output from the synthesis tool an output model of the design for implementing the design to meet both the constraint files.

6. The method of claim 5, wherein the first constraint file including at least one first constraint is directed to higher speed operation of the integrated circuit than is the second constraint file including at least one second constraint.

7. The method of claim 5, wherein the first constraint file including at least one first constraint is directed to tower power operation of the integrated circuit than is the second constraint file including at least one second constraint.

8. The method claim 5, wherein the first constraint file including at least one first constraint is directed to higher fidelity performance of the integrated circuit than is the second constraint file including at least one second constraint.

9. A computer system, comprising: a CPU; a storage; and a bus coupling the CPU to the storage; wherein the storage stores a code for execution by the CPU, the code performing a method of synthesis of multiple implementations of an integrated circuit design comprising:
receiving a model of the design comprising an algorithm implemented by the design;
receiving a first constraint file including at least one first constraint upon implementation of the model;
inputting the model of the design and the first constraint file to a synthesis tool;
receiving as output from the synthesis tool an output model of the design for implementing the design to meet the at least one first constraint;
receiving a second constraint file including at least one second constraint upon. implementation of the model;
inputting the model of the design and the second constraint file to the synthesis tool;
receiving as output from the synthesis tool an output model of the design for implementing the design to meet the at least one second constraint;
changing the model of the design to produce a changed model of the design;
inputting the changed model of the design and the first constraint file to the synthesis tool; and
receiving as output from the synthesis tool an output model of the design for implementing the design to meet the at least one first constraint.

10. The system of claim 9, wherein the first constraint file including at least one first constraint is directed to higher speed operation of the integrated circuit than is the second constraint file including at least one second constraint.

11. The system of claim 9, wherein the first constraint file including at least one first constraint is directed to lower power operation of the integrated circuit than is the second constraint file including at least one second constraint.

12. The system of claim 9, wherein the first constraint file including at least one first constraint is directed to higher fidelity performance of the integrated circuit than is the second constraint file including at least one second constraint.

13. A computer system, comprising: a CPU; a storage; and a bus coupling the CPU to the storage; wherein the storage stores a code for execution by the CPU, the code performing a method of synthesis of multiple implementations of an integrated circuit design comprising:
receiving a model of the design comprising an algorithm implemented by the design;
receiving a first constraint file including at least one first constraint upon implementation of the model;
inputting the model of the design and the first constraint file to a synthesis tool;
receiving as output from the synthesis tool an output model of the design for implementing the design to meet the at least one first constraint;
receiving a second constraint file including at least one second constraint upon implementation of the model;
inputting the model of the design and the second constraint file to the synthesis tool;
receiving as output from the synthesis tool an output model of the design for implementing the design to meet the at least one second constraint;
changing the model of the design to produce a changed model of the design;
inputting the changed model of the design and the constraint files to the synthesis tool; and
receiving as output from the synthesis tool an output model of the design for implementing the design to meet both the constraint files.

14. The system of claim 13, wherein the first constraint file including at least one first constraint is directed to higher speed operation of the integrated circuit than is the second constraint file including at least one second constraint.

15. The system of claim 13, wherein the first constraint file including at least one first constraint is directed to tower power operation of the integrated circuit than is the second constraint file including at least one second constraint.

16. The system of claim 13, wherein the first constraint file including at least one first constraint is directed to higher fidelity performance of the integrated circuit than is the second constraint file including at least one second constraint.

17. A computer readable storage device storing code for performing a method of synthesis of multiple implementations of an integrated circuit design, wherein the method comprises:
receiving a model of the design comprising an algorithm implemented by the design;
receiving a first constraint file including at least one first constraint upon implementation of the model;
inputting the model of the design and the first constraint file to a synthesis tool;
receiving as output from the synthesis tool an output model of the design for implementing the design to meet the at least one first constraint;
receiving a second constraint file including at least one second constraint upon implementation of the model;
inputting the model of the design and the second constraint file to the synthesis tool;
receiving as output the synthesis tool an output model of the design for implementing the design to meet the at least one second constraint;
changing the model of the design to produce a changed model of the design;
inputting the changed model of the design and the first constraint to the synthesis tool; and
receiving as output from the synthesis tool an output model of the design for implementing the design to meet the at least one first constraint.

18. The computer readable storage device of claim 17, wherein the first constraint file including at least one first constraint is directed to higher speed operation of the integrated circuit than is the second constraint file including at least one second constraint.

19. The computer readable storage device of claim 17, wherein the first constraint file including at least one first constraint is directed to lower power operation of the integrated circuit than is the second constraint file including at least one second constraint.

20. The computer readable storage device of claim 17, wherein the first constraint file including at least one first constraint is directed to higher fidelity performance of the integrated circuit than is the second constraint file including at least one second constraint.

21. A computer readable storage device storing code for performing a method of synthesis of multiple implementations of an integrated circuit design, wherein the method comprises:
  receiving a model of the design comprising an algorithm implemented by the design;
  receiving a first constraint file including at least one first constraint upon implementation of the model;
  inputting the model of the design and the first constraint file to a synthesis tool;
  receiving as output from the synthesis tool an output model of the design for implementing the design to meet the at least one first constraint;
  receiving a second constraint file including at least one second constraint upon implementation of the model;
  inputting the model of the design and the second constraint file to the synthesis tool;
  receiving as output from the synthesis tool an output model of the design for implementing the design to meet the at least one second constraint;
  changing the model of the design to produce a changed model of the design;
  inputting the changed model of the design and the constraint files to the synthesis tool; and
  receiving as output from the synthesis tool an output model of the design for implementing the design to meet both the constraint files.

22. The computer readable storage device of claim 21, wherein the first constraint file including at least one first constraint is directed to higher speed operation of the integrated circuit than is the second constraint file including at least one second constraint.

23. The system of claim 21, wherein the first constraint file including at least one first constraint is directed to lower power operation of the integrated circuit than is the second constraint file including at least one second constraint.

24. The system of claim 21, wherein the first constraint file including at least one first constraint is directed to higher fidelity of the integrated circuit than is the second constraint file including at least one second constraint.

* * * * *